US011412637B2

(12) United States Patent
Kärppä et al.

(10) Patent No.: US 11,412,637 B2
(45) Date of Patent: Aug. 9, 2022

(54) APPARATUS FOR CONDUCTING HEAT

(71) Applicant: ABB Schweiz AG, Baden (CH)

(72) Inventors: Jaani Kärppä, Helsinki (FI); Hanna Rapinoja, Helsinki (FI); Pyry Hartikainen, Helsinki (FI)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 16/888,944

(22) Filed: Jun. 1, 2020

(65) Prior Publication Data

US 2020/0383242 A1    Dec. 3, 2020

(30) Foreign Application Priority Data

May 31, 2019 (EP) ..................................... 19177625

(51) Int. Cl.
*H05K 7/20* (2006.01)
*H01R 13/00* (2006.01)
*H01R 13/73* (2006.01)

(52) U.S. Cl.
CPC ......... *H05K 7/20254* (2013.01); *H01R 13/73* (2013.01); *H05K 7/20218* (2013.01); *H05K 7/20436* (2013.01); *H01R 13/005* (2013.01)

(58) Field of Classification Search
CPC ........... H05K 7/20218; H05K 7/20254; H05K 7/20436; H01R 13/005
See application file for complete search history.

(56) References Cited

U.S. PATENT DOCUMENTS

| | | | | | |
|---|---|---|---|---|---|
| 3,823,771 | A | * | 7/1974 | Ludwig | H01L 25/03 165/80.4 |
| 4,108,008 | A | * | 8/1978 | Jowett | G01L 19/0007 73/756 |
| 5,751,077 | A | * | 5/1998 | Gonzalez | H02K 9/19 310/12.29 |
| 6,637,538 | B2 | * | 10/2003 | Morykon | F16B 21/18 180/313 |
| 8,276,780 | B2 | * | 10/2012 | Oltman | F16L 5/08 220/661 |

(Continued)

FOREIGN PATENT DOCUMENTS

| | | | | |
|---|---|---|---|---|
| CN | 205003613 U | | 1/2016 | |
| EP | 3043421 A1 | * | 7/2016 | ............ B60L 53/302 |

OTHER PUBLICATIONS

European Patent Office, Extended Search Report issued in corresponding Application No. 19177625.1, dated Dec. 10, 2019, 7 pp.

*Primary Examiner* — Robert J Hoffberg
(74) *Attorney, Agent, or Firm* — Leydig, Voit & Mayer, Ltd.

(57) ABSTRACT

An apparatus for conducting heat, including a substrate for receiving one or more electric components and a thermal substance circulation system. The substrate includes a first interface for receiving a first part of the thermal substance circulation system and a second interface for receiving a second part of the thermal substance circulation system such that the substrate is, when in use, in contact with the thermal substance of the circulation system between the first and the second interface. The substrate is heat conductive for transferring heat between the one or more electric components and the thermal substance of the circulation system.

9 Claims, 4 Drawing Sheets

(56) References Cited

U.S. PATENT DOCUMENTS

| | | | | |
|---|---|---|---|---|
| 8,297,341 | B2* | 10/2012 | Liang | H01L 23/367 |
| | | | | 165/80.3 |
| 8,659,897 | B2* | 2/2014 | Meijer | G06F 1/20 |
| | | | | 361/699 |
| 9,132,724 | B2* | 9/2015 | Krachler | H01R 13/518 |
| 9,362,040 | B2* | 6/2016 | Rai | H05K 7/20927 |
| 10,164,373 | B1* | 12/2018 | Cheon | H01R 13/005 |
| 10,850,623 | B2* | 12/2020 | Chung | B60K 1/00 |
| 2012/0308858 | A1* | 12/2012 | Hermann | H01M 50/183 |
| | | | | 429/82 |
| 2012/0308859 | A1* | 12/2012 | Hermann | H01M 50/24 |
| | | | | 429/82 |
| 2015/0282291 | A1 | 10/2015 | Singh et al. | |
| 2019/0126773 | A1* | 5/2019 | Chung | B60L 15/007 |
| 2019/0293213 | A1* | 9/2019 | Swietlik | F16L 5/12 |
| 2020/0267888 | A1* | 8/2020 | Putz | A01B 76/00 |
| 2020/0313328 | A1* | 10/2020 | Mathews | B60L 53/302 |

* cited by examiner

APPARATUS FOR CONDUCTING HEAT

FIELD OF THE INVENTION

The invention relates to an apparatus for conducting heat in electronic equipment.

BACKGROUND OF THE INVENTION

Electric components used in the electronic equipment generate excess heat in use. The excess heat may cause, for example, a risk of overheating that may cause damages for the electric components and the equipment. Heating may also limit, for example, performances of the components and hence, the components may not be utilized as efficiently as possible. Therefore, there is a need for an effective cooling solution for the components of the electronic equipment. The cooling may be carried out, for example, by a structure wherein the excess heat is conducted away from the components.

Current heat conduction solutions may not be effective and hence, there is a need for more sophisticated solution for the heat conduction.

BRIEF DESCRIPTION OF THE INVENTION

The invention is defined by the independent claim.
Embodiments of the invention are defined in the dependent claims.

BRIEF DESCRIPTION OF THE DRAWINGS

In the following the invention will be described in greater detail by means of preferred embodiments with reference to the attached drawings, in which.

DETAILED DESCRIPTION OF THE INVENTION

The following embodiments are only examples. Although the specification may refer to "an" embodiment in several locations, this does not necessarily mean that each such reference is to the same embodiment(s), or that the feature only applies to a single embodiment. Single features of different embodiments may also be combined to provide other embodiments. Furthermore, words "comprising" and "including" should be understood as not limiting the described embodiments to consist of only those features that have been mentioned and such embodiments may contain also features/structures that have not been specifically mentioned.

As described in Background, the electric components used in the electronic equipment generates excess heat in use. The electronic equipment normally comprises a cooling system for cooling the components. The cooling system may be, for example, a thermal substance circulation system, wherein a cooling substance is circulated in the equipment. The excess heat generated by the electric components is conducted to the cooling substance that decreases a temperature of the components. A route, used for conducting heat from the component to the cooling substance, may comprise several interfaces that may reduce efficiency of the heat conduction. Hence, the interfaces in the route should be avoided to an achieve efficient cooling system for the heating components in the electronic equipment.

A solution according to the invention provides a sophisticated solution for an efficient heat conduction between the components and the thermal substance of the cooling system used in the electronic equipment.

In an embodiment, an apparatus for conducting heat, comprising: a substrate for receiving one or more electric components and a thermal substance circulation system, wherein the substrate comprises a first interface for receiving a first part of the thermal substance circulation system and a second interface for receiving a second part of the thermal substance circulation system such that the substrate is, when in use, in contact with the thermal substance of the circulation system between the first and the second interface, and wherein the substrate is heat conductive for transferring heat between the one or more electric components and the thermal substance of the circulation system.

Figure 1:
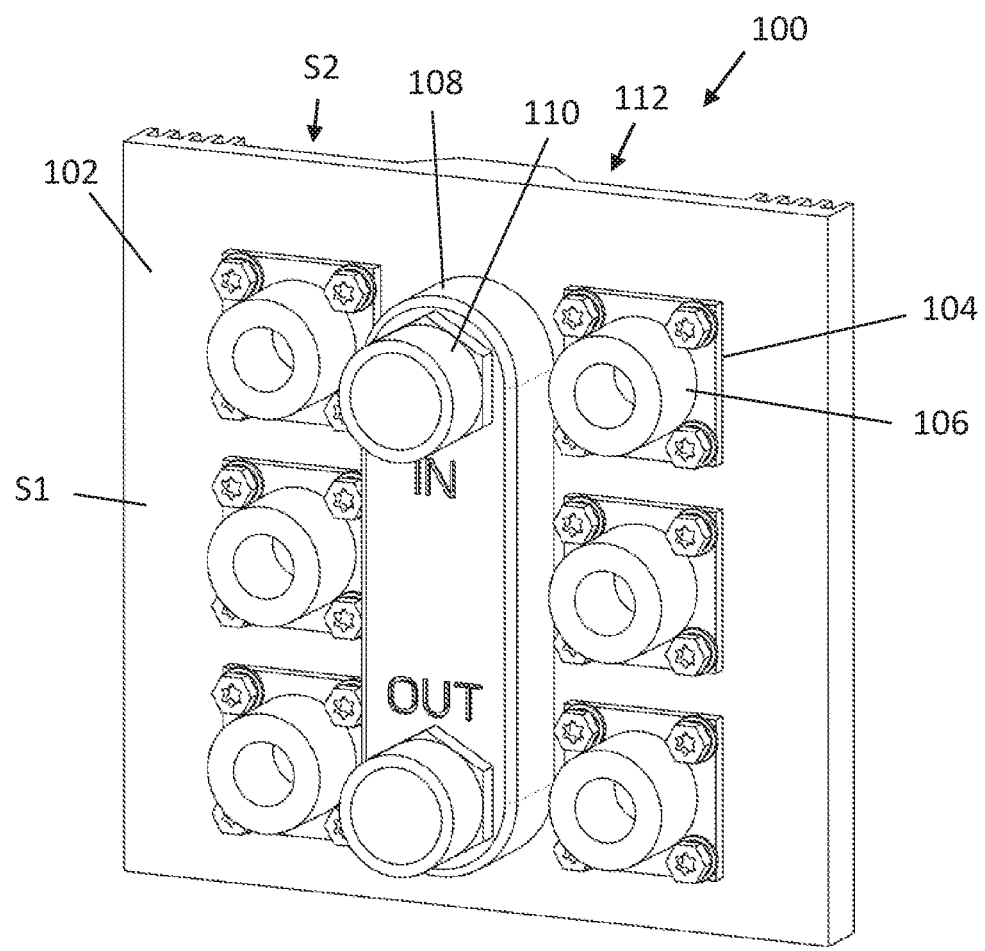
FIG. 1 illustrates an apparatus according to an embodiment.

Referring to FIG. 1, wherein the apparatus 100 according to an embodiment is illustrated. The apparatus comprises the substrate 102 that is a connection plate for the electric components and the thermal substance circulation system. The substrate 102 may be coupled, for example, with the electronic equipment. The substrate 102 comprises one or more couplings 104 for receiving the one or more electric components 106. The coupling is, for example, a mechanical feature on the substrate to which the electric component may be assembled. The mechanical feature may be formed by the substrate, in other words, the coupling may be made of the same material like the substrate and is then integral part of the substrate. The coupling may also comprise separate components assembled to the substrate. The electric components may be assembled to the substrate, for example, by screws or soldering such that the components are in contact with the substrate. The contact between the components and the substrate ensures that heat, generated by the components, conducts to the substrate. In some case, a thermal material like, for example, a thermal pad or gel may be used to improve the heat conduction between the component and the substrate. The electric components may be assembled on one or multiple side(s) of the substrate. The component may also go through the substrate and is then on two sides of the substrate.

The substrate 102 further comprises at least one coupling 108 for connectors 110, 112 of the thermal substance circulation system. The thermal substance circulation system is not illustrated in FIG. 1. The coupling 108 for the circulation system is, for example, a mechanical feature on the substrate 102 to which the connector(s) of the circulation system may be connected. The mechanical feature may be formed by the substrate, in other words, the coupling may be made of the same material like the substrate and is then integral part of the substrate. The coupling may also comprise separate components assembled to the substrate. The thermal substance circulation system is used to circulate thermal substance in flow channels of the electronic equipment in which the substrate is assembled. The thermal substance is used to conduct heat from the components of the electronic equipment to the thermal substance or the other way around, from the thermal substance to the components. In other words, the thermal substance circulation system may be used for either cooling or heating the electronic equipment.

There may be an inlet and outlet for the thermal substance of the circulation system in the substrate. The thermal substance may be led into the equipment via the inlet and out of the equipment via the outlet. In an embodiment, the substrate comprises coupling for the inlet and outlet connectors of the thermal substance. The solution according to the invention focuses on the inlet of the thermal substance that is used for leading the thermal substance into the electronic equipment. The first and the second connectors 110, 112 may be used in the inlet of the thermal substance circulation system. The thermal substance circulation system may comprise the first part and the second part. The first part of the thermal substance circulation system may be outside of the electronic equipment and the second part of the thermal substance circulation system may be inside of the electronic equipment. Hence, the first part of the system feeds the thermal substance into the electronic equipment and the second part circulates the substance inside the equipment. The first and second parts of the thermal circulation system may comprise connectors configured to be connected with the first and the second connectors 110, 112 placed on the substrate.

The substrate 102 may comprise the first connector 110 and the second connector 112 for connecting the thermal substance circulation system with the substrate. The connectors may comprise a locking member for locking the connectors with the substrate and/or with the circulation system. The electronic equipment may have, for example, a sheet metal casing to which the substrate is assembled, and the thermal substance circulation system may be coupled with the substrate from outside and inside of the casing.

The substrate may be assembled to the electronic equipment such that a first side S1 of the substrate is outside the casing and a second side S2 of the substrate is inside the casing. The first connector 110 of the thermal substance circulation system may be placed on the first side S1 of the substrate and the second connector 112 on the second side S2 of the substrate. Hence, the first part of the thermal substance circulation system may be connected to the first connector 110 and the second part of the thermal substance circulation system to the second connector 112.

Hence, the first and second connectors are coupled with the substrate such that they are on the opposite sides of the substrate and the substrate may be substantially between the connectors. In other words, the thermal substance is led thought the substance such that the substrate is in contact with the thermal substance. A connection between the connector(s) placed on the substrate and the thermal substance circulation system may comprise a sealing member to prevent leaking of the thermal substance out of the system.

Figure 2:
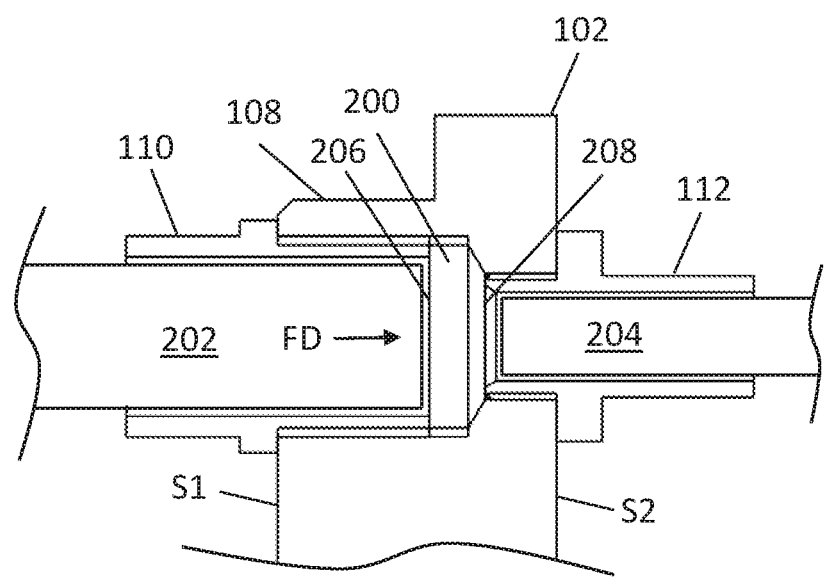
FIG. 2 illustrates a connection between a substrate and a thermal substance circulation system according to an embodiment.

Referring to FIG. 2, wherein a cross section of the substrate is illustrated. The substrate 102 comprises the first interface 206 for receiving the first part 202 of the thermal substance circulation system and the second interface 208 for receiving the second part 204 of the thermal substance circulation system. The first interface 206 may be at end of the first connector 110 and the second interface 208 may be at end of the second connector 112. Said ends refer to a part of the connector that is inside the substrate and said ends may be opposite to each other when assembled to the substrate. Between the first and the second interfaces 206, 208 is a passage 200 that is used for leading the thermal substance through the substrate 102 from the first part 202 of the circulation system to the second part 204 of the circulation system, in other words, from the first connector 110 to the second connector 112. The passage 200 may be formed into the substrate 102 and hence, the substrate 102 is in contact with the thermal substance via the passage 200 and is then a part of the liquid circulation system. An arrow FD illustrates a flow direction of the thermal substance.

In an embodiment, the substrate is made of a heat conductive material. As described, the substrate is coupled with the one or more electric components and the thermal substance of the circulation system. Hence, the substrate forms very effective heat conductor for conducting the heat between the components and the thermal substance of the circulation system. The heat conductor formed by the substrate is in contact with the components and the thermal substance and hence, there is not any extra interfaces in the heat conductor. The heat conductor without the interfaces provides very effective solution for the heat conduction.

As described above, the solution according to the invention, wherein the electric components and connector(s) of the thermal substance circulation system are in the same substrate, provides an effective and a simple solution for heat conduction.

In an embodiment, the thermal substance comprises a liquid. Hence, the thermal substance circulation system is a liquid circulation system used for the heat conduction. In addition to the liquid, for example, gas or any other substance suitable for the heat transfer may be used instead of the liquid. In addition, a combination of the different thermal substances may be used.

In an embodiment, the substrate is the heat conductor for conducting the heat from the one or more electric components to the liquid of the circulation system. In other words, the substrate may be used for cooling the components that generates the heat in the electronic equipment. As described, the solution according to the invention may be used for conducting heat from components to the liquid or from the liquid to the components. When the heat is conducted from the components to the liquid, the substrate is used for cooling and when the heat is conducted form the liquid to the components, the substrate is used for heating the components. Hence, the solution according to the invention may be applied for both cooling and heating the components but the invention is described from the cooling point of view. Because the invention is applied for cooling, the liquid in the circulation system is a coolant having a high thermal capacity.

Figure 3:
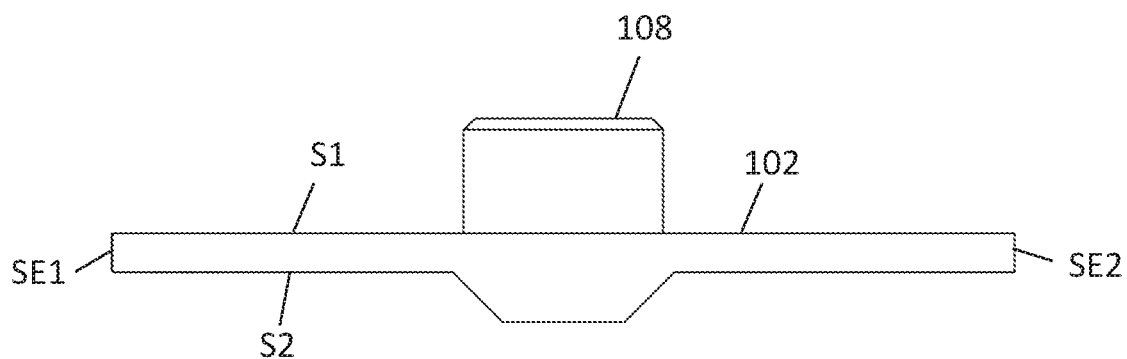
FIG. 3 illustrates the substrate according to an embodiment.

In an embodiment, a shape of the substrate is substantially a plate. Referring to FIG. 3, wherein a top view of the substrate 102 is illustrated. The plate-shaped substrate 102 may have two sides S1, S2 to which the couplings for the one or more electric components and the connectors of the liquid circulation system may be placed. In addition, side edges SE1, SE2 of the substrate are illustrated in FIG. 3. A thickness of the substrate 102 may vary according to the needs. The substrate 102 may be thicker when more efficient heat conduction is needed. The thickness may also vary in different points of the substrate 102. For example, the substrate 102 may be thicker in the middle wherein the coupling 108 for the liquid circulation system is and the thickness may decrease towards the side edges SE1, SE2. For example, a heat load may increase from side edges SE1, SE2 towards the middle of the substrate 102 and hence, the material thickens towards the middle of the substrate 102 to achieve the efficient heat conduction.

In an embodiment, the first and the second interfaces are substantially in a centre area of the substrate. The distance between a heat source and a cooling element should be as short as possible to achieve high cooling capacity. Therefore, a structure of the cooling system should be arranged so that the heat sources are placed nearby the cooling element. Referring to FIG. 3, the coupling 108 for the connectors of the liquid circulation system is substantially in the middle of the substrate 102, in other words, in the centre area of the substrate 102, and the distance between the coupling 108 and side edges SE1, SE2 is substantially equal. The electric components may be placed, for example, on the first side S1 of the substrate 102 and on the both sides of the coupling 108 of the liquid circulation system such that the all components are evenly distributed nearby the cooling liquid. The components that generates the heat most should be placed nearest to the cooling liquid. Then the heat conduction distance between the components and the cooling liquid is optimized to be as short as possible and the cooling of the components is efficient.

Figure 4:
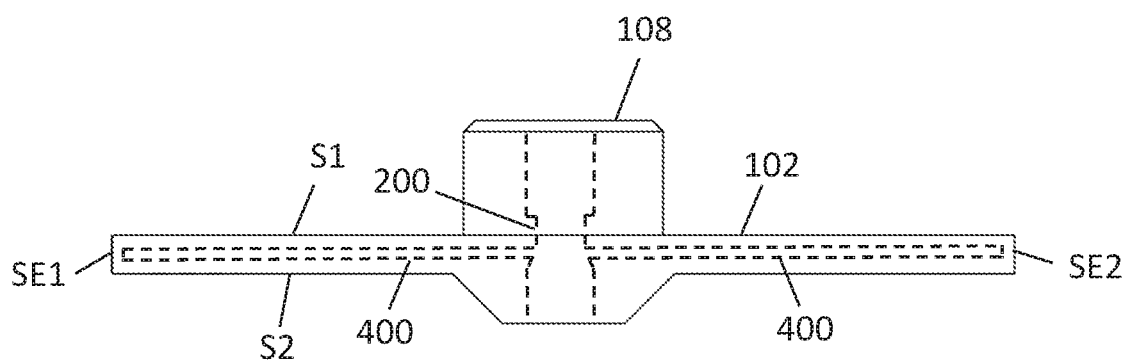
FIG. 4 illustrates the substrate according to an embodiment.

In an embodiment, the substrate comprises at least one flow channel for the thermal substance of the circulation system. As described, the substrate comprises the passage 200 between the first and the second interface 206, 208 wherein the cooling liquid is in contact with the substrate 102. In addition, the substrate may comprise the flow channel(s) for circulating the liquid in the substrate. The flow channel may be an integral part of the substrate or a separate component coupled with the substrate. Referring to FIG. 4, the flow channels 400 may be coupled with the passage 200 such that the liquid can flow into the channels 400. The flow channel may extend from the passage 200 towards the first and/or second side edges SE1, SE2. This structure brings the cooling liquid closer with the components assembled on the first and the second sides S1, S2 that generates the heat. When the components and the cooling liquid are closer to each other, the heat conduction is more efficient. In an embodiment, the substrate may comprise a plurality of the flow channels such that the flow channels and the passage forms a channel network in the substrate for enhancing the cooling.

In an embodiment, the coupling for the first connector of the liquid circulation system may locate far from the coupling of the second connector of the liquid circulation system, for example, such that the first coupling and connector is nearby the first side edge and the second coupling and the connector is nearby the second side edge. Hence, the passage between the couplings forms the flow channel inside the substrate between the side edges and cooling liquid may flow through the substrate from the first to the second side edge, for example.

Figure 5A:
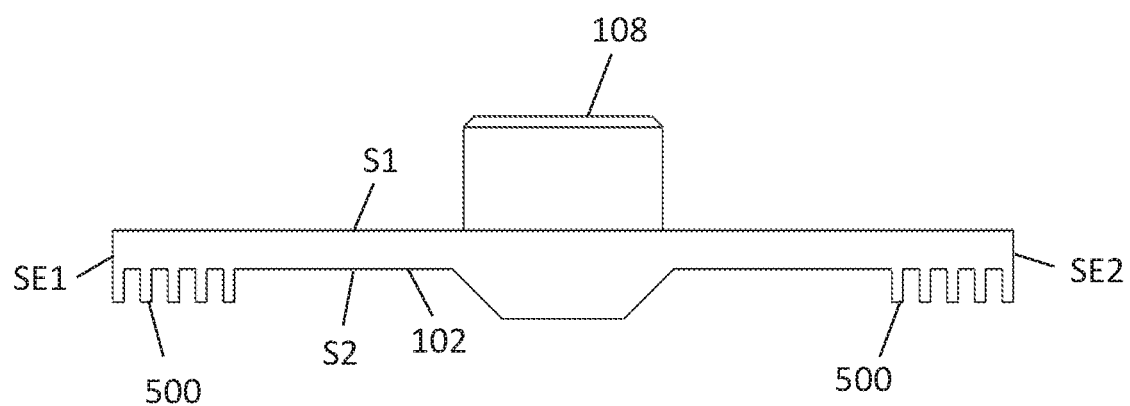
FIGS. 5A and 5B illustrate the substrate according to embodiments.
Figure 5B:
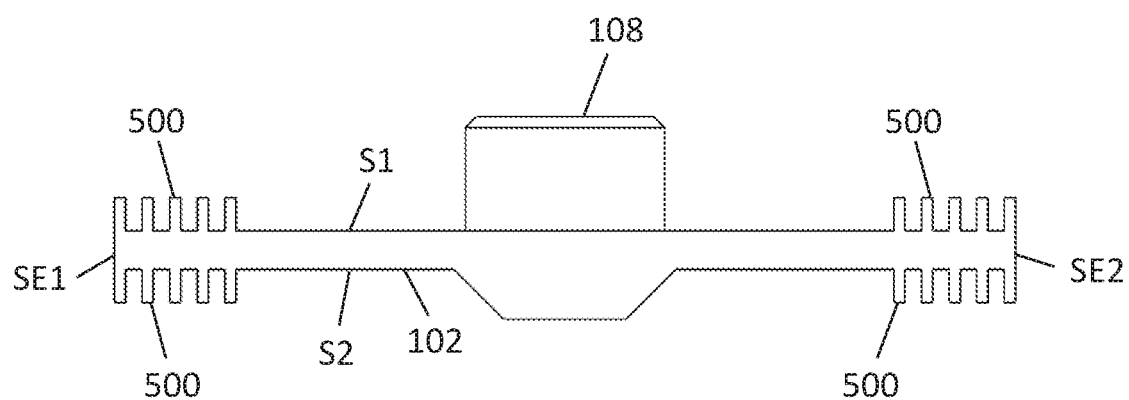

FIG. 5A illustrates an embodiment, wherein the substrate 102 comprises at least one cooling fin 500 on one side of the substrate. The cooling fin may be an integral part of the substrate or it may be a separate part coupled with the substrate. The cooling fins may be placed on the both sides of the coupling 108 of the liquid circulation system, for example, on the second side S2 of the substrate. The cooling fins 500 add area of the substrate 102 and hence, enhance cooling capacity. The cooling fins 500 may decrease a temperature of an ambient air of the components 106 and hence, may decrease a temperature of the components 106. The cooling fins may also conduct the heat from the components to the ambient air that may also decrease the temperature of the components. The components are not illustrated in FIG. 5A. A shape and size of the cooling fins may vary according to the needs. A location of the cooling fins on the substrate may also vary. The cooling fins may be placed, for example, nearby the components. The substrate together with the cooling fins and the cooling liquid enables very effective solution for cooling the components of the electronic equipment. In an embodiment, the cooling fin comprises the flow channel(s) wherein the cooling liquid is circulated to enhance the cooling capacity. In an embodiment, the substrate comprises at least one cooling fin on multiple sides of the substrate. Referring to FIG. 5B, wherein the substrate 102 with cooling fins 500 on the multiple sides is illustrated. The cooling fins are placed on both sides S1, S2 of the substrate 102 that makes the area of the substrate 102 larger and improves the cooling capacity of the substrate 102. For example, the components may go through the substrate 102 and when the cooling fins 500 are on the both sides S1, S2 of the substrate 102, the cooling capacity is enhanced on the both sides of the substrate. In another example, the components may be assembled on the both sides S1, S2 of the substrate. Then the cooling fins on the first side S1 enhance the cooling capacity on the first side S1, and the cooling fins on the second side S2 enhance the cooling capacity on the second side S2.

In an embodiment, the substrate is an integral part of the thermal substance circulation system. As described, the substrate may be assembled to the electronic equipment covered by the sheet metal casing. The substrate may be assembled to the casing such that first side S1 of the substrate is outside the casing and second side S2 is inside. The first connector of the liquid circulation system may be coupled with the first side of the substrate to which the first part of the circulation system is connected, and the second connector may be coupled with the second side to which the second part of the circulation system is connected. The second connector and the second part of the circulation system may be inside the casing for connecting the substrate to the liquid circulation system that is inside the casing. Referring to FIG. 2, wherein the substrate 102, the second connector 112 and the second part of the circulation system 204 is illustrated. In an embodiment, the second part of the circulation system 204 may be integrated with the substrate 102 such that the substrate is a part of the circulation system inside the casing, not separate part coupled with the system by the connector. The first part of the circulation system may still be detachably connected with the substrate by the first connector and used for leading the cooling liquid to the electronic equipment. In an embodiment, the first part of the liquid circulation system may be integrated with the substrate. In another embodiment, the first and the second parts are integrated with the substrate such that the substrate is the integral part of the liquid circulation system.

In an embodiment, a material of the substrate comprises aluminium. A heat conduction performance of aluminium is high and, hence it is suitable material for the heat conduction. Aluminium is also light and easy to machine to different shapes. For example, a machining or casting may be used as a manufacturing method to form a desired shape of the substrate. In addition to aluminium, some other material may be used in the substrate like, for example, other metals or plastics. In an embodiment, different materials may be mixed in the substrate. For example, the substrate may have an aluminium frame but may also have some features made of the other material.

In an embodiment, the substrate is an extruded aluminium profile. The extruding is very effective method to manufacture the aluminium profiles. It is easy and cheap method to manufacture different kind of shapes from aluminium. In an embodiment, in addition to the extruding, some other manufacturing methods may be used for manufacturing the substrate. For example, the substrate may be made by the extruding but some features of the substrate may be machined after the extruding.

In an embodiment, the one or more electric components comprise an electric connector. The electric connector may be, for example, a counter connector for a cable. In other words, the cables may be connected to the electronic equipment via the electric connectors placed on the substrate. Hence, the electric connector may be an electric interface between the electronic equipment and external connections. The cables connected to the electrical connectors may be used, for example, for conducting current into the electronic equipment. The connectors generates heat, when the current is conducted through them and heating may limit the current that can be conducted through the connectors. When the connectors are assembled to the substrate, the heat generated by the connectors is conducted to the cooling liquid via the substrate. Hence, the connectors may be cooled down efficiently and higher currents may be conducted though the connectors and the cable connections may be utilized efficiently.

In an embodiment, the one or more electrical components are in direct contact with the substrate. The components may be, at least partly, in direct contact with the substrate. When the components like, for example connectors, are coupled directly with the substrate, the excess interfaces in the heat conduction route may be avoided. Hence, the substrate is directly in contact with the heat source and the cooling element that enables very effective solution for conducting heat and cooling down the heat source. The substrate may comprise, for example, a mechanical feature wherein the component, like the connector, may be assembled such that the component is in the direct contact with the substrate. In an embodiment, some extra part may be used between the component and the substrate. The part may be, for example, a pedestal for the component. The component may be assembled to the pedestal and the pedestal to the substrate such that the component is in the contact with the substrate directly and/or via the pedestal. The pedestal may be heat conductive like the substrate.

In an embodiment, the apparatus further comprises a cover for covering at least partly the substrate when the cover is in a closed position. The cover is not illustrated in Figures. The cover is used for protecting the sensitive connectors on the substrate, for example, against mechanical damages. As described, the substrate may be assembled to the casing of the electronic equipment such that the first side of the substrate is outside and the second side inside the casing. The cover may be assembled to the first side of the substrate that is outside of the equipment. The first side of the substrate is protected by the cover and the second side by the casing of the electronic equipment. The one or more components and/or the connectors of the thermal substance circulation system may stay, at least partly, under the cover when the cover is in the closed position. In one example, the whole substrate is under the cover. The cover may be locked to the substrate by screws or some other locking member. The cover may further comprises lead-ins for possible cables and the thermal substance circulation system. The cover may be made of aluminium or some other metal. In addition to the metals, also plastic may be used in the cover. The cover may also comprise a combination of the different materials. The manufacturing method of the cover may comprise, for example, a machining or casting.

In an embodiment, the apparatus further comprises a sealing member for sealing an interface between the cover and a counterpart when the cover is in the closed position. In addition to the mechanical damages, the cover may be used to protect the components and connectors against dust and moisture. Hence, the apparatus may further comprise the sealing member for sealing the interface between the cover and its counterpart that prevents ingress of dust and moisture. In an embodiment, the counterpart is, for example, the substrate. In another embodiment, the counterpart is the electronic equipment, for example, the casing of the electronic equipment. The sealing member may be coupled to the counterpart or the cover. The sealing member may be, for example, a polymer gasket. The gasket may be placed, on the counterpart such that it circulates the components and connectors placed on the substrate and forms a uniform shape around them. The gasket may also circulate the whole substrate such that the interface between the substrate and the casing of the electronic equipment is inside the uniform shape. When the cover is in the closed state, the gasket presses between the cover and counterpart and forms the sealed interface. In addition, the lead-ins in the cover may comprise the sealing members such that also the lead-ins are sealed against dust and moisture. In other words, dust and moisture may not ingress under the cover via lead-ins when the cover is in the closed state.

Next example describes how the apparatus, wherein the heat source and cooling element are in the same substrate, may be applied in the electronic equipment for cooling. The electronic equipment may have the thermal substance circulation system for cooling the equipment, wherein the cooling liquid is circulated inside the equipment. The substrate, made of the heat conducting material, may be assembled to the casing of the electronic equipment. The substrate may comprise the electric connectors for the cables and the connectors for the cooling liquid circulation system. The cooling liquid circulation system may be coupled with the substrate from outside and inside of the casing of the electronic equipment. In other words, the circulation system may be coupled with the substrate such that the first part of the circulation system is connected to the first connector of the substrate that is on the outside surface of the substrate. Respectively, the second part of the circulation system is connected to the second connector of the substrate that is on the inside surface of the substrate. Hence, the substrate is substantially between the first and second connectors and between the first and second part of the circulation system. The substrate forms the passage between the connectors and is in contact with the cooling liquid via the passage. The direct contact with the cooling liquid cools down the substrate very effectively.

The cables may be connected to the electric connectors and may be used for conducting current into the electronic equipment. The current generates heat when conducted through the connectors. Heating of the connector may limit the current that can be conducted via the cables and through the connectors and hence, the cables cannot necessarily be utilized as efficiently as possible. The substrate, coupled directly with the cooling liquid and heating connectors, creates the effective heat conductor because there are no excess interfaces in the heat conductor. In other words, the substrate is in direct contact with the heat source and the cooling element and hence, provides effective solution for cooling the heat source. The distance between the electrical connectors and the cooling liquid is optimized such that it is as short as possible. The substrate may further comprise the cooling fins that further improves the cooling capacity of the substrate.

The solution according to the invention, wherein the heating electronic connectors and the cooling system are coupled with the same substrate, is very effective and a simple way for cooling the connectors of the electronic equipment. It make possible to use higher currents with the connectors and better performance of the cables coupled with the electronic equipment.

It will be obvious to a person skilled in the art that, as the technology advances, the inventive concept can be implemented in various ways. The invention and its embodiments are not limited to the examples described above but may vary within the scope of the claims.

The invention claimed is:

1. An apparatus for conducting heat, comprising:
    a substrate having two or more couplers for receiving two or more electric components, and a thermal substance circulation system, wherein the two or more electric components are coupled directly onto the substrate via the two or more couplers such that conduction of the heat between the two or more electric components and the substrate is effected, wherein the substrate comprises:
        a body that is generally plate-shaped and defines a first planar side and a second planar side, the second planar side opposite the first planar side, wherein the two or more couplers are disposed on at least one of the first or second planar sides of the body,
        a first interface on the first planar side of the body of the substrate for receiving a first part of the thermal substance circulation system,
        a second interface on the second planar side of the body of the substrate for receiving a second part of the thermal substance circulation system,
        a passage being integrated within the body and extending between the first interface and the second interface, the passage extending perpendicularly to the first and second planar surfaces of the substrate, and
        at least one flow channel formed in the body and fluidly coupled and extending perpendicularly to the passage and extending proximate to the two or more electronic components such that the passage and the at least one flow channel, when in use, are in contact with a thermal substance flowing through the circulation system between the first interface and the second interface,
    wherein the two or more couplers are arranged and disposed in a center area of the substrate, and wherein the substrate is heat conductive for transferring the heat between the two or more electric components and the thermal substance of the circulation system.

2. The apparatus according to claim 1, wherein the thermal substance of the circulation system comprises a liquid.

3. The apparatus according to claim 1, wherein the first interface and/or the second interface is/are substantially in the center area of the substrate.

4. The apparatus according to claim 1, wherein the substrate further comprises at least one first cooling fin on the first planar side of the substrate.

5. The apparatus according to claim 4, wherein the substrate further comprises at least one second cooling fin on the second planar side of the substrate.

6. The apparatus according to claim 1, wherein a material of the substrate comprises aluminum.

7. The apparatus according to claim 6, wherein the substrate is an extruded aluminum profile.

8. The apparatus according to claim 1, wherein the two or more electric components each comprises an electric connector.

9. The apparatus according to claim 1, wherein the first and second interfaces are disposed in axially aligned relation such that the passage extends through the substrate along an axis.

* * * * *